(12) United States Patent
Lee et al.

(10) Patent No.: US 7,589,422 B2
(45) Date of Patent: Sep. 15, 2009

(54) MICRO-ELEMENT PACKAGE HAVING A DUAL-THICKNESS SUBSTRATE AND MANUFACTURING METHOD THEREOF

(75) Inventors: Seung Wan Lee, Suwon-si (KR); Min Seog Choi, Seoul (KR); Kyu Dong Jung, Suwon-si (KR); Woon Bae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 11/523,530

(22) Filed: Sep. 20, 2006

(65) Prior Publication Data

US 2007/0216028 A1    Sep. 20, 2007

(30) Foreign Application Priority Data

Mar. 14, 2006   (KR) .................... 10-2006-0023407

(51) Int. Cl.
*H01L 23/48* (2006.01)
(52) U.S. Cl. ................. 257/734; 257/E27.046
(58) Field of Classification Search ............... 257/434, 257/E27.046, E21.075, E31.078, 738
See application file for complete search history.

(56) References Cited

U.S. PATENT DOCUMENTS

| | | | |
|---|---|---|---|
| 2004/0077121 A1* | 4/2004 | Maeda et al. | 438/75 |
| 2004/0087043 A1* | 5/2004 | Lee et al. | 438/6 |
| 2004/0229405 A1 | 11/2004 | Prabhu | |
| 2005/0056903 A1* | 3/2005 | Yamamoto et al. | 257/433 |
| 2005/0095750 A1 | 5/2005 | Lo et al. | |

FOREIGN PATENT DOCUMENTS

| | | |
|---|---|---|
| KR | 10-2005-0076781 A | 7/2005 |
| KR | 10-2005-0087738 A | 8/2005 |
| KR | 10-2005-0093752 A | 9/2005 |

* cited by examiner

*Primary Examiner*—Thao p. Le
(74) *Attorney, Agent, or Firm*—Sughrue Mion, PLLC

(57) ABSTRACT

A micro-element package which can reduce manufacturing costs and can be advantageous for mass production due to simplifying its structure and manufacturing process, and also can facilitate miniaturization and promote thinness, and a method of manufacturing the micro-element package. The micro-element package includes: a substrate having a micro-element on its top surface and a comparatively thin surrounding portion provided around the micro-element; and a circuit board that is electrically connected to the micro-element by utilizing the surrounding portion as a medium.

5 Claims, 17 Drawing Sheets

MICRO-ELEMENT PACKAGE HAVING A DUAL-THICKNESS SUBSTRATE AND MANUFACTURING METHOD THEREOF

CROSS-REFERENCE TO RELATED APPLICATION

This application claims priority from Korean Patent Application No. 10-2006-0023407, filed on Mar. 14, 2006, in the Korean Intellectual Property Office, the disclosure of which is incorporated herein by reference.

BACKGROUND OF THE INVENTION

1. Field of the Invention

Apparatuses and methods consistent with the present invention relates to a micro-element package and a method of manufacturing the micro-element package, and more particularly, to a micro-element package which can reduce manufacturing costs, can be advantageous for mass production due to simplifying its structure and manufacturing process, and also can facilitate miniaturization and promote thinness, and a method of manufacturing the micro-element package.

2. Description of Related Art

An image sensor is a device which changes light into an electrical signal and utilized in various fields of our daily lives.

The image sensor includes a light receiving portion which generates charges in accordance with received light and a circuit portion which converts the charges into a voltage and processes the converted voltage into a final form. According to a driving method, the image sensor may be divided into a charge coupled device (CCD) image sensor and a complementary metal oxide semiconductor (CMOS) image sensor.

Due to an electronics package technology, the image sensor is manufactured as an image sensor module in an image sensor chip and installed in various types of products.

In this instance, a CMOS image sensor module is manufactured by utilizing a Chip On Board (COB) method, a Chip On Film (COF) method, etc., so that the size and height of the CMOS image sensor module may be reduced according to a recent tendency of light, thin, and miniaturized image sensor modules.

FIG. 1 is a cross-sectional diagram illustrating a structure of an image sensor module according to a related art.

As shown in FIG. 1, the COB method is a method of attaching a printed circuit board (PCB) 10 on a rear surface of the image sensor chip 20 by using a die bonding agent and connecting an electrode of the PCB 10 and an input/output (I/O) terminal of the image sensor chip 20, which can be advantageous for mass production by utilizing a process similar to an existing semiconductor production line.

However, the method as described above must include a space for wire bonding. Accordingly, the image sensor module is enlarged.

Accordingly, in the method as described above, the height of the image sensor module may not be reduced by more than a predetermined value. Also, the method may not be applicable to a device which is manufactured thin and in a small size.

Also, the image sensor module according to the above-described method must be individually packaged in a chip unit. Accordingly, productivity may be deteriorated and manufacturing costs may be increased. Also, in the case of the image sensor module constructed as above, a yield may be deteriorated due to contamination by particles during a manufacturing process.

SUMMARY OF THE INVENTION

The present invention provides a micro-element package which can reduce manufacturing costs and can be advantageous for mass production due to simplifying its structure and manufacturing process, and a method of manufacturing the micro-element package.

The present invention also provides a micro-element package which can be easily and quickly manufactured to be advantageous for mass production and also can prevent a yield from decreasing due to contamination by particles and the like, and a method of manufacturing the micro-element package.

The present invention also provides a micro-element package which can be manufactured thin and in a small size, and a method of manufacturing the micro-element package.

According to an aspect of the present invention, there is provided micro-element package including: a substrate having a micro-element formed on its top surface and a comparatively thin surrounding portion provided around the micro-element; and a circuit board that is electrically connected to the micro-element by utilizing the surrounding portion as a medium. At least one portion of the circuit board constructed as above is accommodated in a recess and, in this state, is attached to the surrounding portion, and may be electrically connected to the micro-element.

The substrate may be formed in various sizes and of various materials. Also, the surrounding portion may be formed by forming the recess on its bottom surface along the substrate. Also, an electrode pad may be provided on the surrounding portion of the substrate to be electrically connected to the micro-element.

In this instance, the micro-element may utilize any one of a micromechanical engineering element, a microelectronics element, and an opto-electronics element. As an example, an image sensor adopted in a camera module as the micromechanical engineering element may be utilized for the micro-element.

A via hole and a solder bump may be provided on the substrate, so that the circuit board may be electrically connected to the micro-element. In this instance, the via hole is formed in the comparatively thin surrounding portion. A seed metal may be interposed between the electrode pad and the solder bump.

A transparent cover may be disposed above the substrate. In this instance, the transparent cover is transparent or formed of a translucent material. As an example, the transparent cover may be formed of a transparent glass. According to circumstances, a functional coating layer may be formed on the transparent cover. Also, the transparent cover is disposed above the micro-element to be separated from the substrate, so that a sealed air cavity may be formed above the micro-element.

BRIEF DESCRIPTION OF THE DRAWINGS

The above and/or other aspects of the present invention will become apparent and more readily appreciated from the following detailed description of exemplary embodiments, taken in conjunction with the accompanying drawings, in which.

DETAILED DESCRIPTION OF EXEMPLARY EMBODIMENTS

Figure 1:
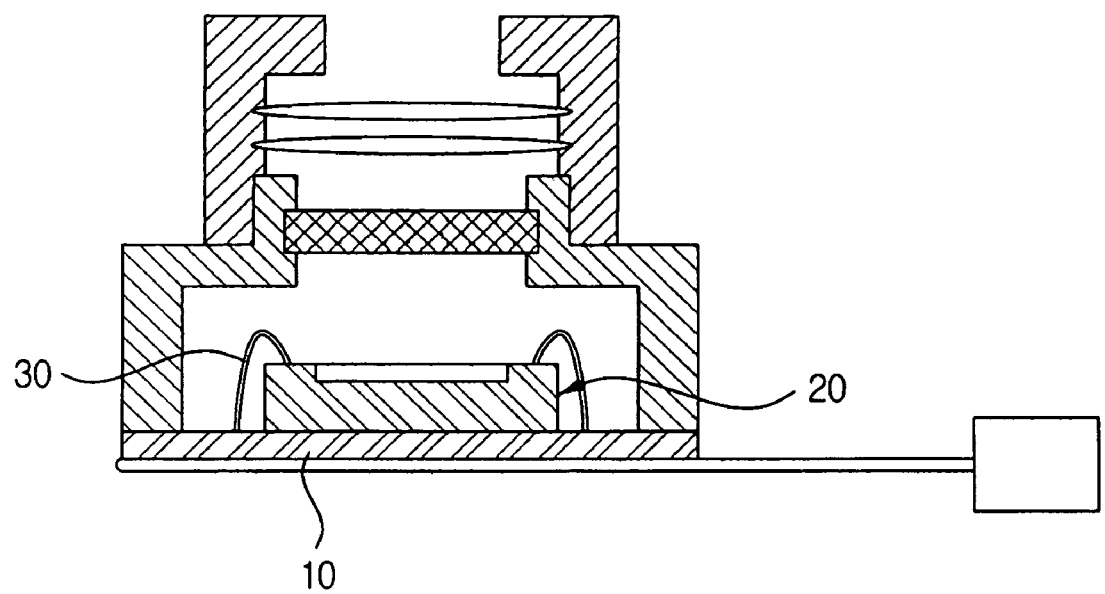
FIG. 1 is a cross-sectional view illustrating a structure of an image sensor module according to a related art.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 2:
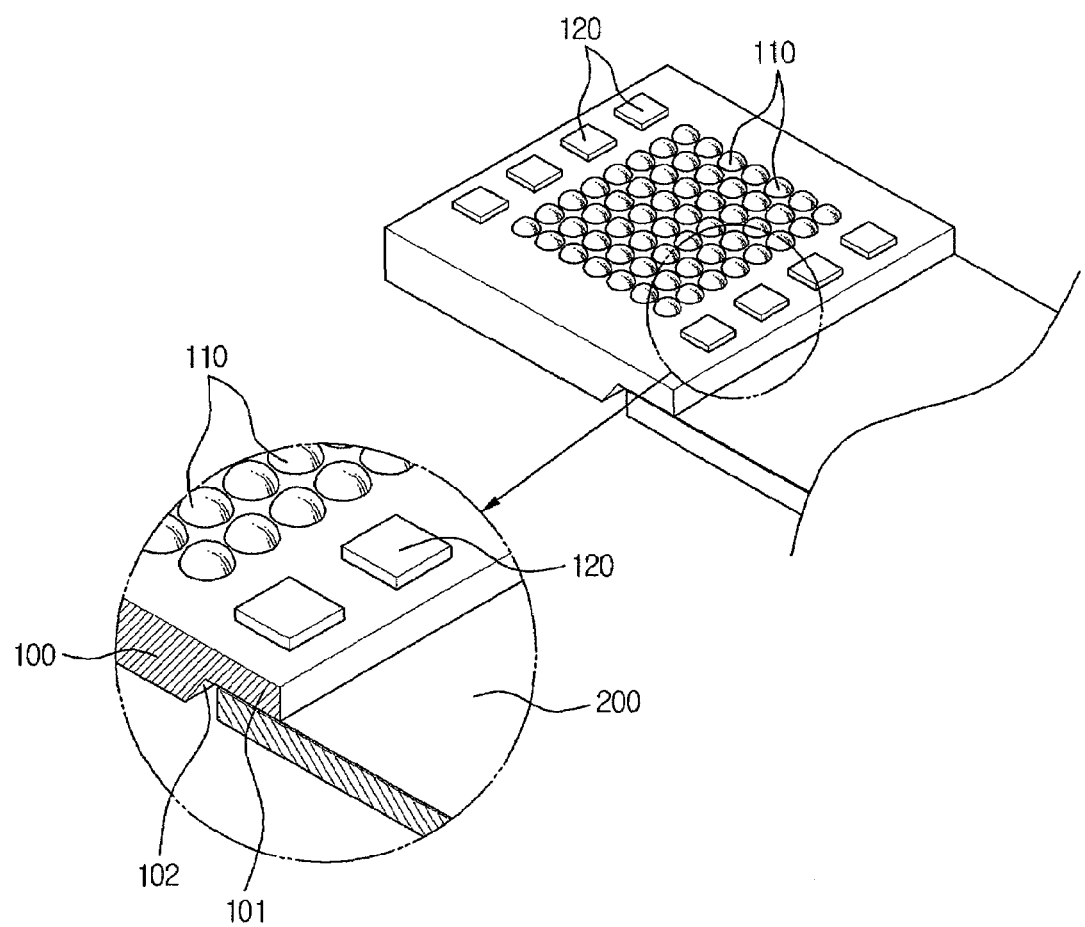
FIG. 2 is a perspective view illustrating a structure of a micro-element package according to an exemplary embodiment of the present invention.
Figure 3:
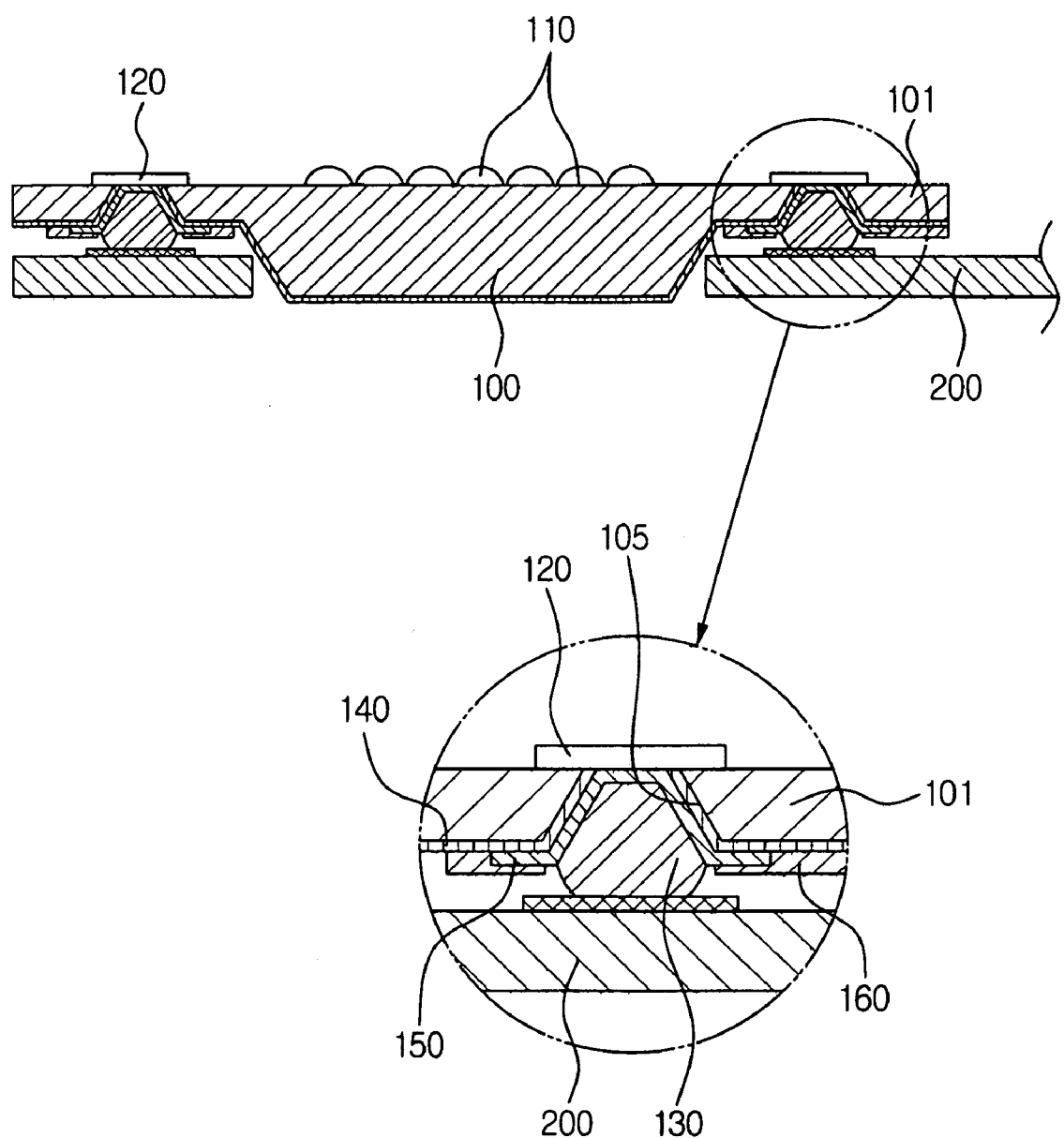
FIG. 3 is a cross-sectional view illustrating a structure of a micro-element package according to an exemplary embodiment of the present invention.

FIG. 2 is a perspective view illustrating a structure of a micro-element package according to an exemplary embodiment of the present invention, and FIG. 3 is a cross-sectional view illustrating a structure of a micro-element package according to an exemplary embodiment of the present invention.

Detailed description with respect to a known function or configuration will be omitted herein for convenience of description.

As shown in FIGS. 2 and 3, the micro-element package according to the present exemplary embodiment includes a micro-element 110, a substrate 100 on which the micro-element 110 is disposed and a circuit board 200. The substrate 100 has a surrounding portion 101, which is relatively thinner than its central portion below the micro-element 110. The substrate 100 is mounted on the circuit board 200 and the micro-element 110 is electrically connected with the circuit board 200 at the surrounding portion 101.

The substrate 100 includes the surrounding portion 101 which is formed with a comparatively thin thickness along the substrate 100. The surrounding portion 101 may be provided by forming a recess 102 on its bottom surface of the substrate 100. The substrate 100 is provided by a wafer made of silicon, in which case the wafers may be provided in various sizes, such as four inches, six inches, eight inches, ten inches, and the like. In the current exemplary embodiment, an example that the substrate 100 is provided by the wafer made of silicon is taken, but depending upon circumstances, the substrate 100 may be provided by a wafer made of lithium-niobate (LiNbO3), lithium tantalite (LiTaO3), quartz, and the like.

A micromechanical engineering element, such as an image sensor, or a microelectronics element and an opto-electronics element may be utilized for the micro-element 110. Hereinafter, an example of utilizing the image sensor which is the micromechanical element for the micro-element 110 will be described.

The micro-element 110 is provided with a plurality of micro-elements and spaced apart by a predetermined distance on a surface of the substrate 100.

The micro-element 110 is formed on the substrate 110. An electrode pad 120 is formed in a certain pattern in a periphery of each of the micro-elements 110 to be electrically connected to each of the micro-elements 110.

The circuit board 200 is attached to the surrounding portion 101 by utilizing the surrounding portion 101 of the substrate 100 as a medium, and is electrically connected to the micro-element 110. Namely, with at least one portion of the circuit board 200 being accommodated in the recess 102 that is formed on a bottom surface of the surrounding portion 101, the circuit board 200 is attached to the surrounding portion 101 and is electrically connected to the micro-element 110. A flexible PCB or a rigid PCB may be utilized as the circuit board 200.

Hereinafter, an example of electrically connecting the circuit board 200 and the electrode pad 120 via a via hole 105 and a solder bump 130 will be described.

The via hole 105 is formed in the surrounding portion 101, so that the bottom surface of the electrode pad 120 may be exposed towards the bottom surface of the substrate 100. The solder bump 130 is provided on the bottom surface of the electrode pad 120 to be electrically connected to the electrode pad 120 via the via hole 105. Accordingly, the circuit board 200 may be electrically connected to the micro-element 110 via the solder bump 130 that is electrically connected to the electrode pad 120.

Also, an insulation layer 140 is formed on the bottom surface of the substrate 100 and a wall surface of the via hole 105 so as to insulate the substrate 100 and the solder bump 130 from each other. The insulation layer 140 may be formed by chemical vapor deposition.

Also, a seed metal 150 may be interposed between the electrode pad 120 and the solder bump 130 so as to improve an attachment of the solder bump 130 and electrically connect the electrode pad 120 and the solder bump 130. In this instance, the seed metal 150 is preferably an under bump metal (UBM). Also, the seed metal 150 may be protected by a passivation layer 160.

As described above, according to an exemplary embodiment of the present invention, the comparatively thin surrounding portion 101 is provided along the substrate 100. Also, the circuit board 200 may be connected to the substrate 100 by utilizing the surrounding portion 101 as a medium. Accordingly, the package may be formed with a thinner thickness. Namely, since the entire height of the image sensor module is decreased, a light, thin, and small-sized module may be manufactured.

In this case, the recess 102 forming the surrounding portion 101 of the substrate 100 is not provided in the entire substrate 100, but only provided along a region where the electrode pad 120 is formed. Accordingly, the substrate 100 may maintain sufficient rigidity.

Also, in an exemplary embodiment of the present invention, the via hole 105 is formed in the comparatively thin surrounding portion 101 on the substrate 100. Accordingly, the structure described above may simplify an electrical connection process, e.g., an insulation layer and a patterning process, via the via hole 105, and reduce process costs. Also, the structure described above may form the via hole 105 by utilizing a comparatively inexpensive wet etching or laser process, not dry etching or electroplating, for forming the conventional deep via hole 105.

Figure 4:
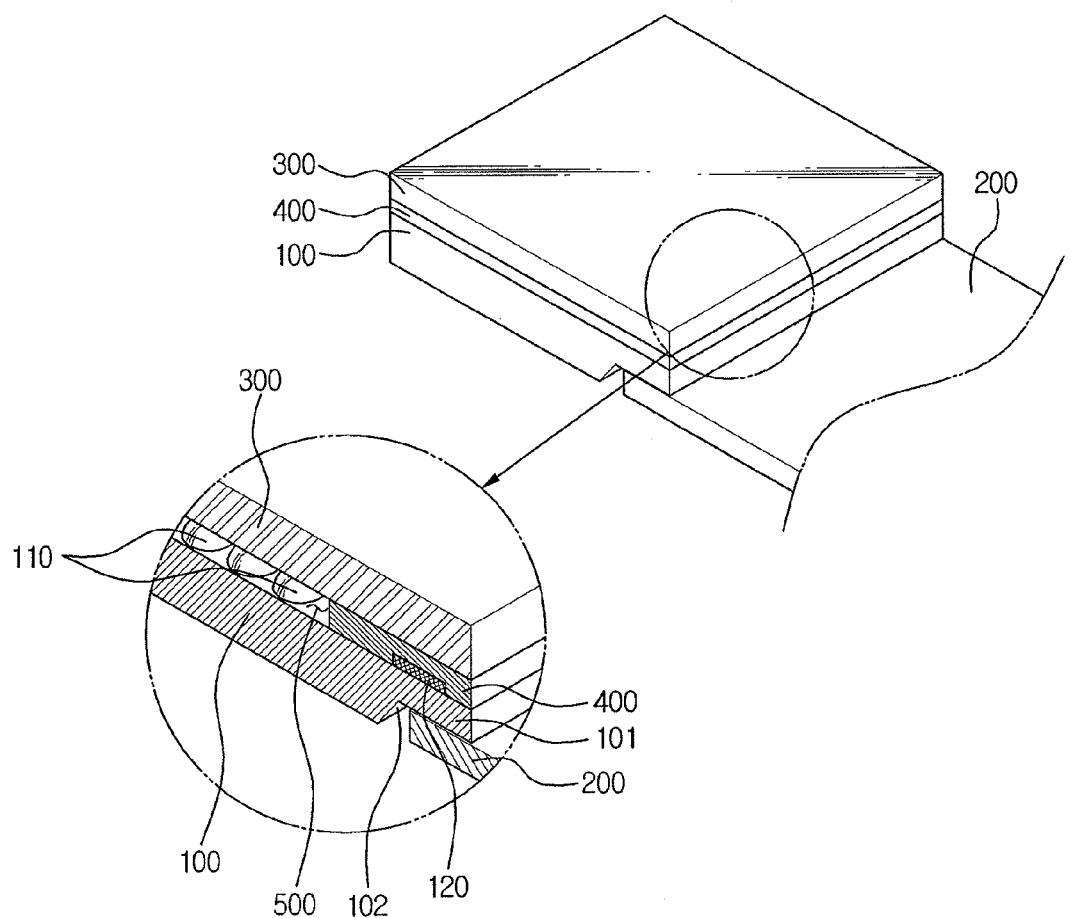
FIG. 4 is a perspective view illustrating a structure of a micro-element package according to another exemplary embodiment of the present invention.
Figure 5:
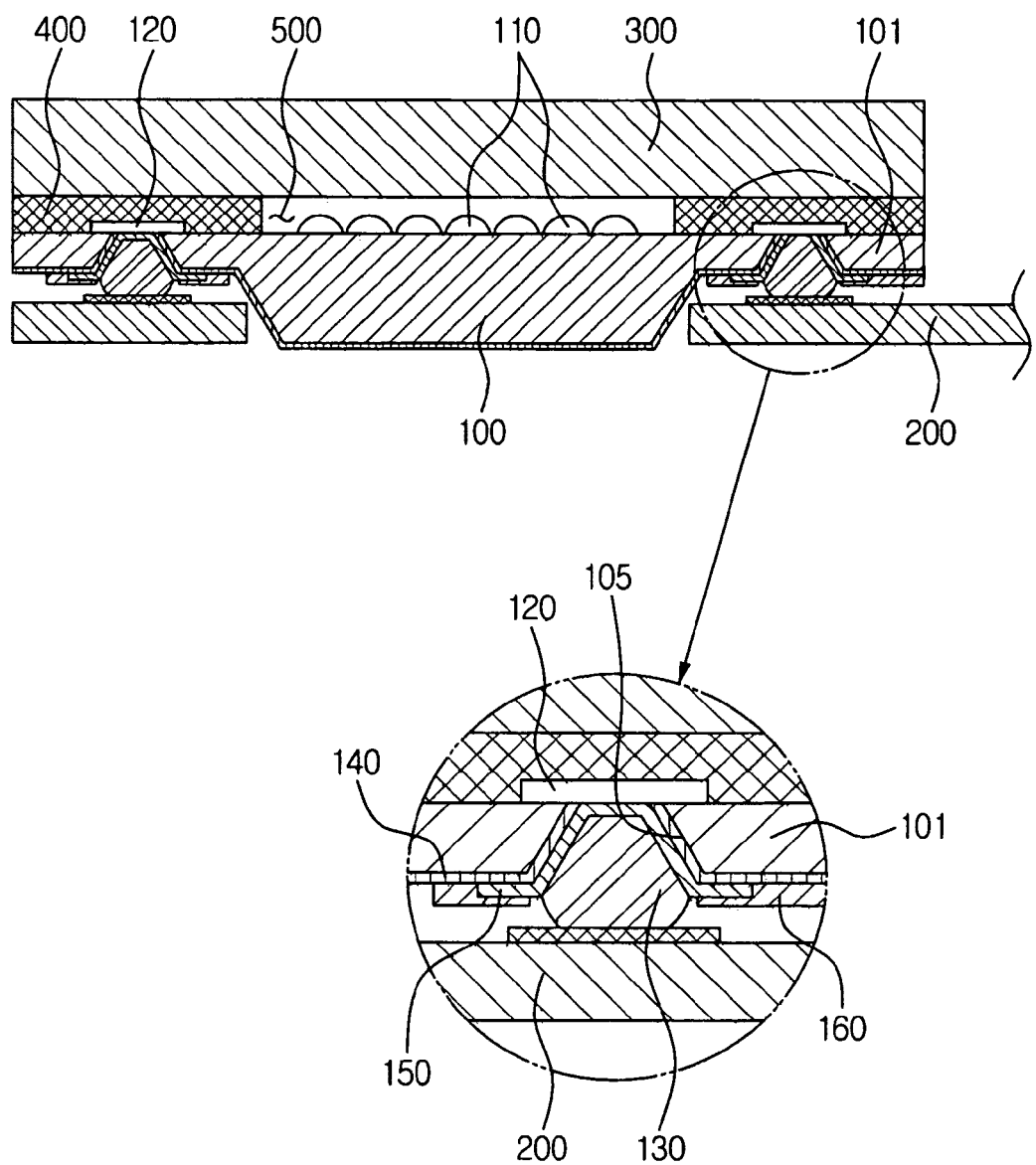
FIG. 5 is a cross-sectional view illustrating a structure of a micro-element package according to another exemplary embodiment of the present invention.

FIG. 4 is a perspective view illustrating a structure of a micro-element package according to another exemplary embodiment of the present invention, and FIG. 5 is a cross-sectional view illustrating a structure of a micro-element package according to another exemplary embodiment of the present invention.

As shown in FIGS. 4 and 5, the micro-element package according to the present exemplary embodiment includes a substrate 100 having a micro-element 110 on its top surface and a recess 102 provided around the micro-element 110 on its bottom surface; a transparent cover 300 disposed above the substrate 100; and a circuit board 200 of which at least one portion is accommodated in the recess 102, is and electrically connected to the micro-element 110.

The substrate 100 may be provided from a wafer that is made of silicon. The recess 102 is provided around the micro-element 110 on a bottom surface of the substrate 100.

A micromechanical engineering element, such as an image sensor, or a microelectronics element and an opto-electronics element may be utilized for the micro-element 110.

The micro-element 110 is formed on the substrate 100. The electrode pad 120 is formed in a certain pattern on the substrate 100 corresponding to a region above the recess 102, to be electrically connected to the micro-element 110.

The transparent cover 300 may be formed of a transparent or translucent material. As an example, the transparent cover 300 may be formed of a transparent glass which has an almost identical size and shape to, e.g., the substrate 100. Depending upon exemplary embodiments, a functional coating layer, such as an antireflection coating layer and an infrared ray-proof coating layer, may be formed on the transparent cover 300.

The transparent cover 300 is disposed above the substrate 100 to be separated from the substrate 100 by a predetermined distance so that a sealed air cavity 500 may be formed above the micro-element 110.

In this instance, the air cavity 500 may be formed by a spacer interposed between the substrate 100 and the transparent cover 300.

The spacer may be provided to cover the electrode pad 120. Also, the spacer may be formed by attaching a sealing pattern 400 utilizing a thermal pressing and the like. In this instance, the sealing pattern 400 is formed on at least one of the top surface of the substrate 100 and the bottom surface of the transparent cover 300. Also, the sealing pattern 400 is formed of epoxy resin.

The sealed air cavity 500 may be formed between the substrate 100 and the transparent cover 300 above the micro-element 110, by the spacer that is formed by the sealing pattern 400.

With at least one portion of the circuit board 200 being accommodated in the recess 102 that is formed on the bottom surface of the substrate 100, the circuit board 200 is attached to the substrate 100 and electrically connected to the micro-element 110. Also, when the circuit board 200 is accommodated in the recess 102, the circuit board 200 may be disposed to not be projected more than the bottom surface of the substrate 100. A flexible PCB or a rigid PCB may be utilized for the circuit board 200.

Hereinafter, an example of electrically connecting the circuit board 200 and the electrode pad 120 via the via hole 105 and the solder bump 130, will be described.

The via hole 105 is formed in the substrate 100, so that the bottom surface of the electrode pad 120 may be exposed towards the recess 102. The solder bump 130 is provided on the bottom surface of the electrode pad 120 to be electrically connected to the electrode pad 120 via the via hole 105. Accordingly, the circuit board 200 may be electrically connected to the micro-element 110 via the solder bump 130.

Also, an insulation layer 140 is formed on the bottom surface of the substrate 100 and a wall surface of the via hole 105 so as to insulate the substrate 100 and the solder bump 130 from each other. The insulation layer 140 may be formed by chemical vapor deposition.

Also, a seed metal 150 may be interposed between the electrode pad 120 and the solder bump 130 so as to electrically connect the electrode pad 120 and the solder bump 130. In this instance, the seed metal 150 is preferably a UBM. Also, the seed metal 150 may be protected by a passivation layer 160.

In each of the above-described exemplary embodiment and the present exemplary embodiment, the solder bump 130 is directly formed on the via hole 105, but the present invention is not limited thereto. According to exemplary embodiments, the solder bump 130 may be formed after filling a metal material in the via hole 105.

Also, in the present exemplary embodiment, the circuit board 200 is provided under the substrate 100, but according to embodiments, the circuit board 200 may be provided on the substrate 100.

As described above, according to the present exemplary embodiment, the recess 102 is provided along the substrate 100 on the bottom surface of the substrate 100. Also, when at least one portion of the circuit board 200 is accommodated in the recess 102, the circuit board 200 may be connected to the substrate 100. Accordingly, a thickness of the package may be formed thinner. Namely, since the entire height of the image sensor module is decreased, a light, thin, and small-sized module may be manufactured.

In this case, the recess 102 forming the surrounding portion 101 of the substrate 100 is not provided over the entire substrate 100, but only provided along only a region where the electrode pad 120 is formed. Accordingly, the substrate 100 may maintain sufficient rigidity.

Also, in the present exemplary embodiment, the via hole 105 is formed in the comparatively thin surrounding portion 101 on the substrate 100. Accordingly, the structure described above may simplify an electrical connection process, e.g., an insulation layering process and a patterning process, via the via hole 105, and reduce processing costs. Also, the structure described above may form the via hole 105 by utilizing a comparatively inexpensive wet etching or laser processing, while not utilizing a dry etching or electroplating for forming the conventional deep via hole 105.

Also, since the upper portion of the micro-element 110 is protected by the transparent cover 300, an element surface may not be contaminated by dust, and the like. Also, since the air cavity 500 is formed between the micro-element 110 and the transparent cover 300, a focusing effect may not be deteriorated which is unlike the conventional structure filled with a transparent material. Accordingly, the present invention may be applicable to a high resolution image sensor in which the size of an image pickup device is small.

Hereinafter, a method of manufacturing a micro-element package according to an exemplary embodiment of the present invention will be described.

FIGS. 6 through 15 are views illustrating a method of manufacturing a micro-element package according to an exemplary embodiment of the present invention.

The micro-element package according to the present exemplary embodiment may be manufactured by providing a substrate 100 having a micro-element 110 on its top surface and a comparatively thin surrounding portion 101 provided around the micro-element 110; and connecting a circuit board 200 to be electrically connected to the micro-element 110 by utilizing the surrounding portion 101 as a medium.

Figure 6:
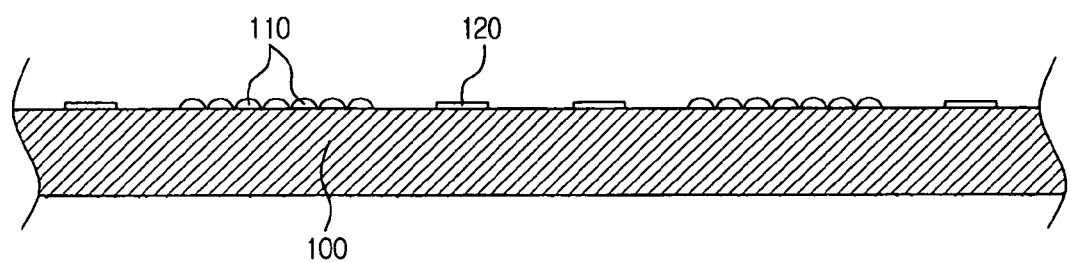
FIGS. 6 through 15 are views illustrating a method of manufacturing a micro-element package according to an exemplary embodiment of the present invention.
Figure 7:
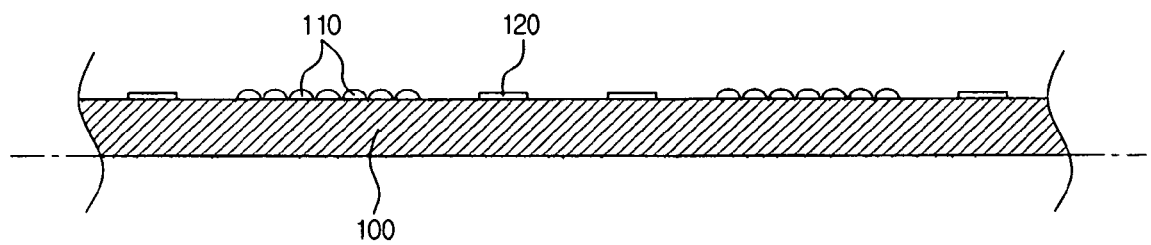
Figure 8:
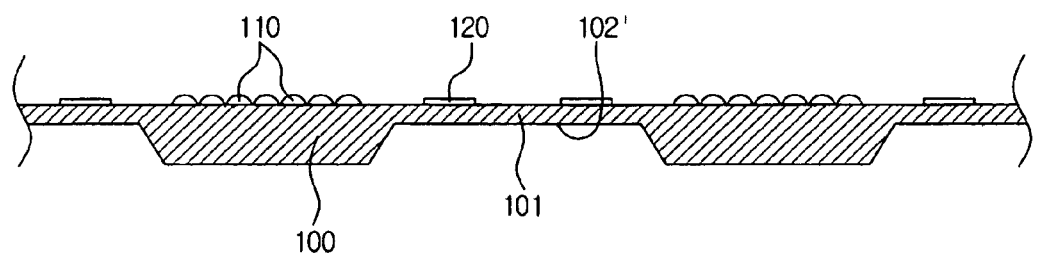

As shown in FIGS. 6 through 8, the substrate 100 formed with the micro-element 110 on its top surface is prepared so as to provide the substrate 100 having the micro-element 110 and the surrounding portion 101.

The substrate 100 may be provided from a wafer that is made of silicon, and be formed in various sizes, e.g. four, six, eight, and ten inches. In the present exemplary embodiment, the substrate 100 is formed of silicon, but the present invention is not limited thereto. According to exemplary embodiments, the substrate 100 may include lithium-niobite (LiNbO3), lithium tantalite (LiTaO3), quartz and the like.

A plurality of micro-elements 110 are formed on the substrate 100 to be spaced apart from each other by a predetermined distance. An electrode pad 120 is provided around each of the plurality of micro-elements 110 in a certain pattern to be electrically connected to each of the plurality of micro-elements 110. In this instance, the electrode pad 120 may be additionally provided during a process of forming the micro-element 110 on the substrate 100.

A micromechanical engineering element, such as an image sensor, or a microelectronics element and an opto-electronics element may be utilized for the micro-element 110.

Next, a groove 102' is formed on the bottom surface of the substrate 100. Depending upon exemplary embodiments, the substrate 100 may be thinned by lapping or grinding the entire bottom surface of the substrate 100, before forming the groove 102', as shown in FIG. 7.

As shown in FIG. 8, after thinning the bottom surface of the substrate 100, the groove 102' is formed on the bottom surface of the substrate 100. Through this, the comparatively thin surrounding portion 101 may be provided on the substrate 100.

The groove 102' is defined in an area between each of the plurality of micro-elements 110 and is formed around the micro-element 110 like a lattice. In this instance, the groove 102' may be formed by an etching or mechanical working. In the present exemplary embodiment, the groove 102' is formed to have a trapezoidal section shape, but the present invention is not limited thereto. Depending upon exemplary embodiments, a groove around a micro-element may be formed to have various types of section shapes, such as a circular section shape.

Figure 9:
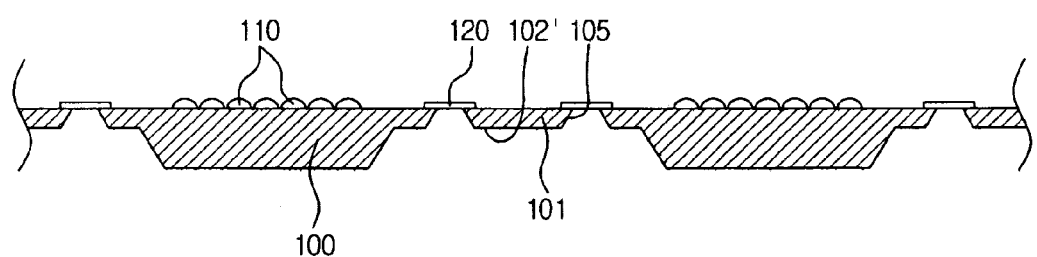

As shown in FIG. 9, to electrically connect the micro-element 110 and the circuit board 200 by utilizing the surrounding portion 101 as a medium, a via hole 105 is formed in the surrounding portion 101 so that the electrode pad 120 may be exposed towards the groove 102'. The via hole 105 may be formed by utilizing a wet etching or laser process. Also, the via hole 105 may be formed by utilizing a dry etching and the like.

Figure 10:
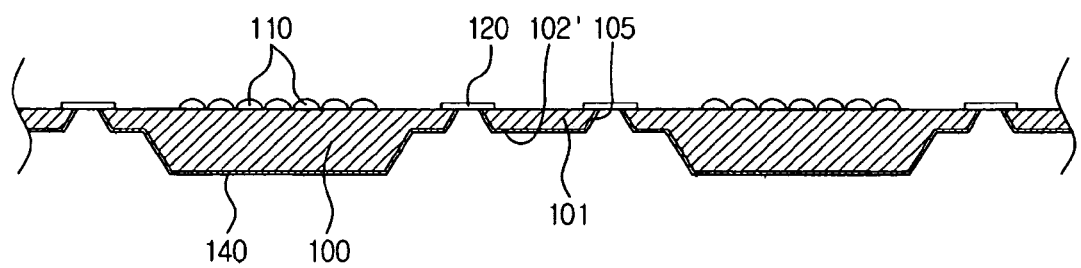

Next, a solder bump 130 (shown in FIG. 13) is formed on the bottom surface of the electrode pad 120, to be electrically connected to the electrode pad 120 via the via hole 105. As shown in FIG. 10, before forming the solder bump 130, an insulation layer 140 is formed on a bottom surface of the substrate 100 and a wall surface of the via hole 105, so as to insulate the substrate the 100 and the solder bump 130 from each other. The insulation layer 140 may be formed by chemical vapor deposition.

Figure 11:
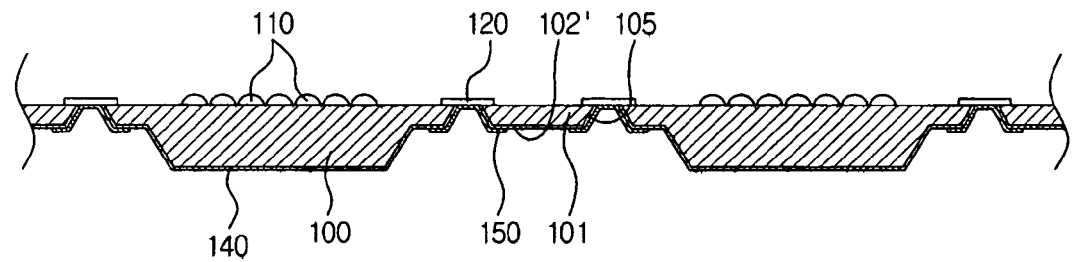
Figure 12:
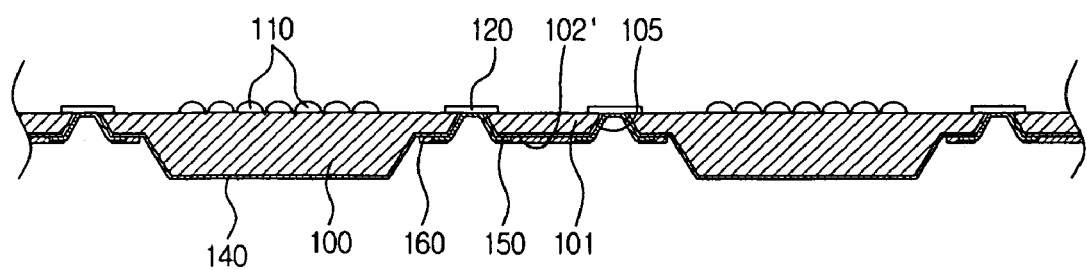

Also, as shown in FIG. 11, a seed metal 150 may be formed on the via hole 105 before forming the solder bump 130, so as to electrically connect the electrode pad 120 and the solder bump 130. As shown in FIG. 12, after forming the seed metal 150, a passivation layer 160 may be formed on an exposed surface of the seed metal 150.

Figure 13:
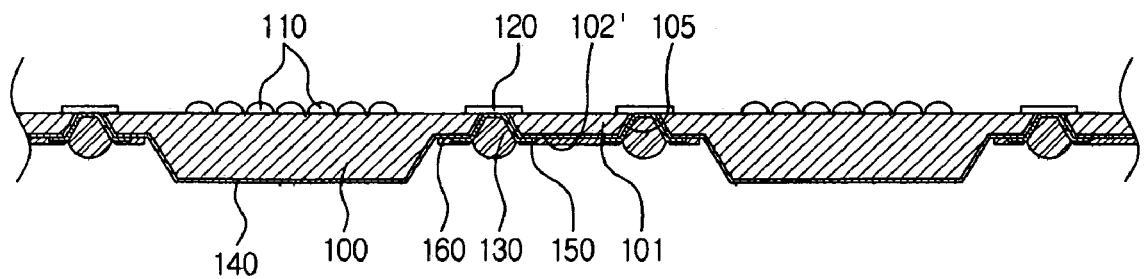

As shown in FIG. 13, after forming the passivation layer 160, the solder bump 130 is formed on the bottom surface of the electrode pad 120 to be electrically connected to the electrode pad 120 via the via hole 105.

Figure 14:
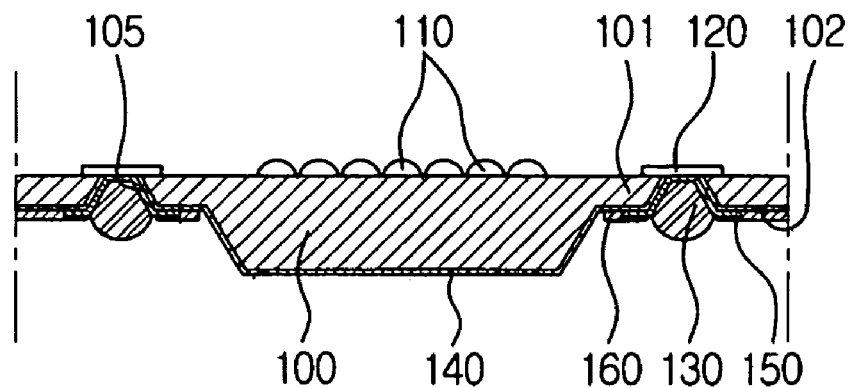

Next, as shown in FIG. 14, pieces of micro-element packages may be provided by dicing the substrate 100 along the groove 102'.

In this case, the dicing of the substrate 100 may be performed by utilizing a general dicing equipment. Accordingly, the substrate 100 may be divided into individual micro-element packages, each including at least one of the plurality of micro-elements 110.

Figure 15:
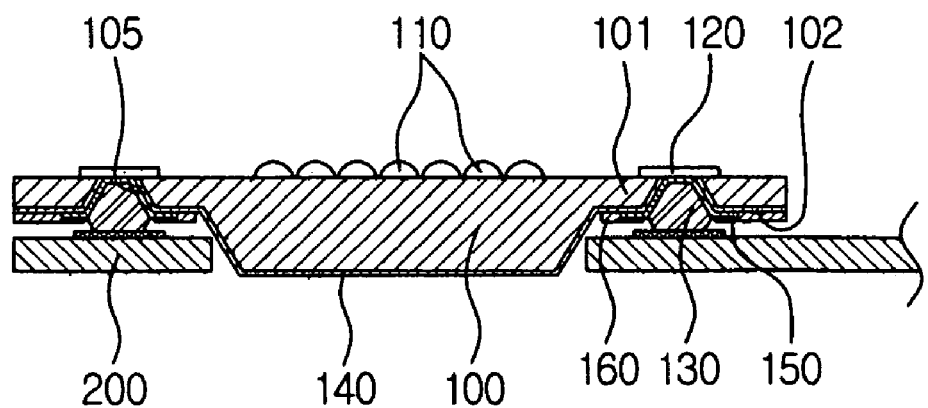

As shown in FIG. 15, the circuit board 200 is attached to the substrate 100 which is divided into the individual micro-element package by a dicing process.

In attaching the circuit board 200, manufacturing of the package may be completed by attaching the circuit board 200 to the surrounding portion 101 with at least one portion of the circuit board 200 being accommodated in the recess 102 via the groove 102', and providing the solder bump 130 on the circuit board 200 utilizing a reflow process or a method of ultrasonic bonding. A flexible PCB or a rigid PCB may be utilized for the circuit board 200.

FIGS. 16 through 28 are views illustrating a method of manufacturing a micro-element package according to another exemplary embodiment of the present invention.

The micro-element package according to the present exemplary embodiment may be manufactured in a wafer level package process. The wafer level package process includes: providing the substrate 100 having the plurality of micro-elements 110 on its top surface to be spaced apart from each other by a predetermined distance; forming the groove 102' on the bottom surface of the substrate 100 along each of the plurality of micro-elements 110; dicing the substrate 100 along the groove 102'; and connecting the circuit board 200 so that at least one portion of the circuit board 200 is accommodated in the recess 102 provided by the groove 102', and electrically connected to the micro-element 110.

Figure 16:
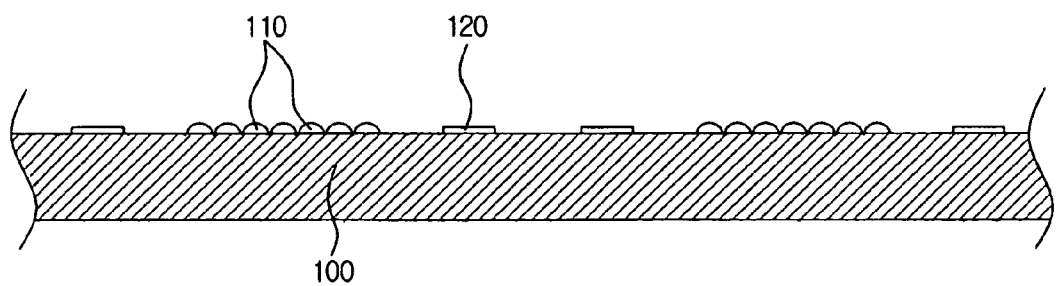
FIGS. 16 through 28 are views illustrating a method of manufacturing a micro-element package according to another exemplary embodiment of the present invention.

As shown in FIG. 16, the substrate 100 formed with the plurality of micro-elements 110 is provided. In this instance, the substrate 100 may be a wafer made of silicon and formed in various sizes, e.g. four, six, eight, and ten inches.

The plurality of micro-elements 110 are formed on the substrate 100 to be spaced part from each other by a predetermined distance. The electrode pad 120 is provided around each of the plurality of micro-elements 110 in a certain pattern to be electrically connected to each of the plurality of micro-elements 110. In this instance, the electrode pad 120 may be additionally provided during the process of forming the micro-element 110 on the substrate 100.

A micromechanical engineering element, such as an image sensor, or a microelectronics element and an opto-electronics element may be utilized for the micro-element 110.

Figure 17:
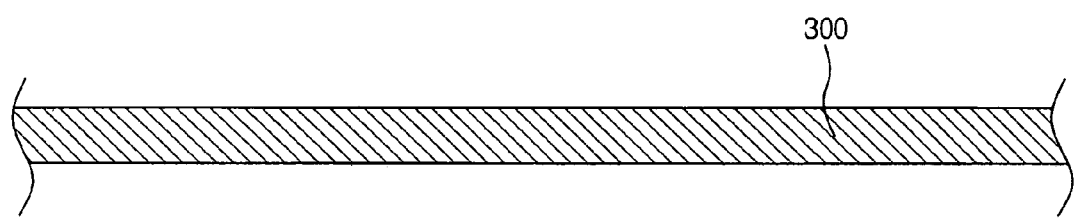

The transparent cover 300, shown in FIG. 17, may be provided at the same time or sequentially after providing the substrate 100.

The transparent cover 300 may be formed of a transparent glass which has an almost identical size and shape to the substrate 100. Depending upon exemplary embodiments, a functional coating layer, such as an antireflection coating layer and an infrared ray-proof coating layer, may be formed on the transparent cover 300.

Next, the transparent cover 300 is disposed above the substrate 100. In this instance, the transparent cover 300 is disposed above the substrate 100 to be separated from the substrate 100 by a predetermined distance so that a sealed air cavity 500 (shown in FIG. 19) may be provided above the micro-element 110.

Figure 18:
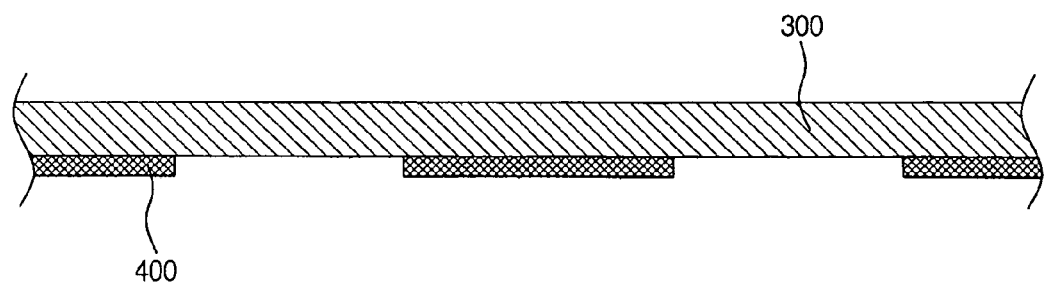

The air cavity 500 described above may be formed by interposing a sealing pattern 400 shown in FIG. 18, between the substrate 100 and the transparent cover 300.

Namely, the disposing of the transparent cover 300 may be performed by forming the sealing pattern 400 on at least one of facing surfaces of the transparent cover 300 and the substrate 100, and a space between the transparent cover 300 and the substrate 100 is sealed up by the sealing pattern 400.

Hereinafter, an example of forming the sealing pattern 400 on only the bottom surface of the transparent cover 300 will be described.

Figure 19:
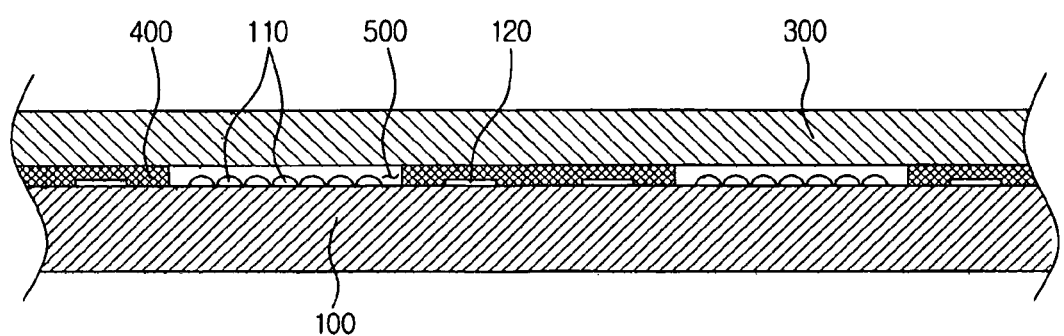

Initially, as shown in FIG. 18, the sealing pattern 400 is formed on only the bottom surface of the transparent cover 300. As shown in FIG. 19, the sealed air cavity 500 may be formed between the transparent cover 300 and the substrate 100 corresponding to a region above the micro-element 110 by attaching the sealing pattern 400 to a top surface of the substrate 100. In this instance, the sealing pattern 400 may be formed of epoxy resin and may be attached by utilizing a thermal compression method. Also, the sealing pattern 400 may be disposed to cover the electrode pad 120.

As described above, the sealing pattern 400 functions as a binding layer between the substrate 100 and the transparent cover 300, and also functions as a sealing for forming the sealed air cavity 500. For this, the sealing pattern 400 must have strong adhesive and sealing properties. Accordingly, the sealing pattern 400 may be attached by an appropriate heat and pressure, so that no opening and no gap may exist between the surfaces where the sealing pattern 400 is attached, and the adhesiveness is preferably regular.

Next, a groove 102' is formed on the bottom surface of the substrate 100. Depending upon exemplary embodiments, the substrate 100 may be thinned by lapping or grinding an entire bottom surface of the substrate 100, before forming the groove 102', as shown in FIG. 20.

Figure 20:
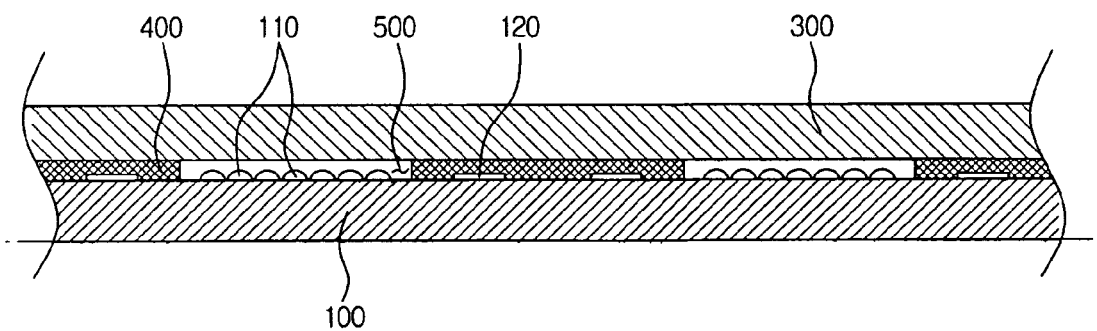
Figure 21:
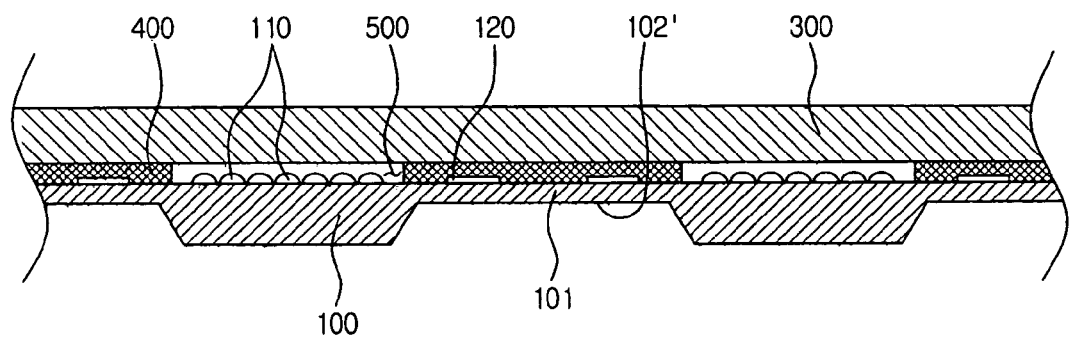

As shown in FIG. 20, after thinning the bottom surface of the substrate 100, the groove 102' is formed on the bottom surface of the substrate 100. Through this, the comparatively thin surrounding portion 101 may be provided on the substrate 100.

The groove 102' is provided in an area between each of the plurality of micro-elements 110 and is formed around the micro-element 110 like a lattice. In this instance, the groove 102' may be formed by an etching or mechanical working.

Figure 22:
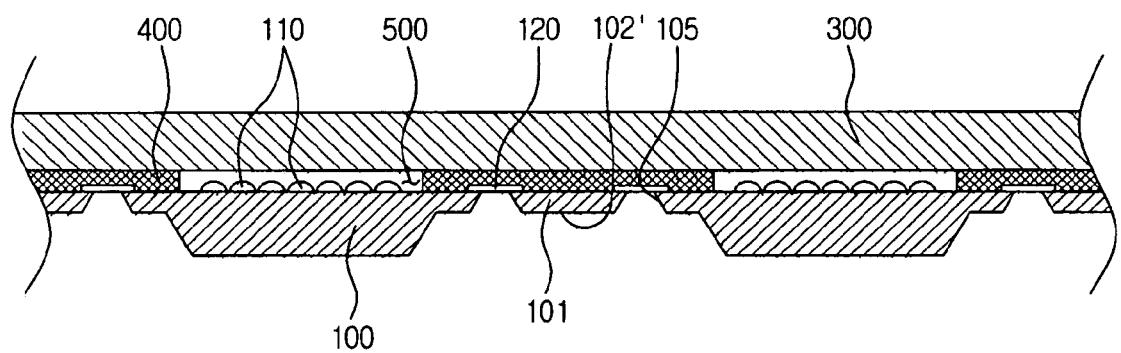

As shown in FIG. 22, to electrically connect the substrate 100 and the circuit board 200 by utilizing the surrounding portion 101 as a medium, the via hole 105 is formed in the surrounding portion 101 so that the electrode pad 120 may be exposed towards the groove 102'. The via hole 105 may be formed by utilizing a wet etching or laser process. Also, the via hole 105 may be formed by utilizing a dry etching and the like.

Figure 23:
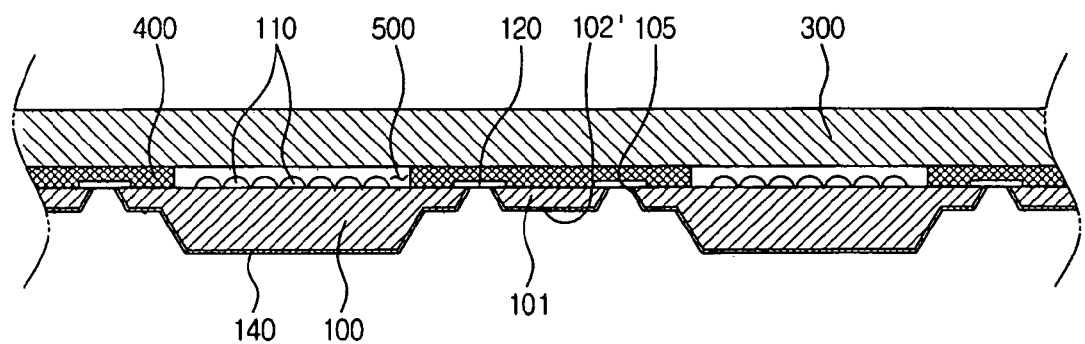

Next, the solder bump 130 is formed on the bottom surface of the electrode pad 120, to be electrically connected to the electrode pad 120 via the via hole 105. As shown in FIG. 23, before forming the solder bump 130, the insulation layer 140 is formed on the bottom surface of the substrate 100 and a wall surface of the via hole 105, so as to insulate the substrate 100 and the solder bump 130 from each other. The insulation layer 140 may be formed by chemical vapor deposition.

Figure 24:
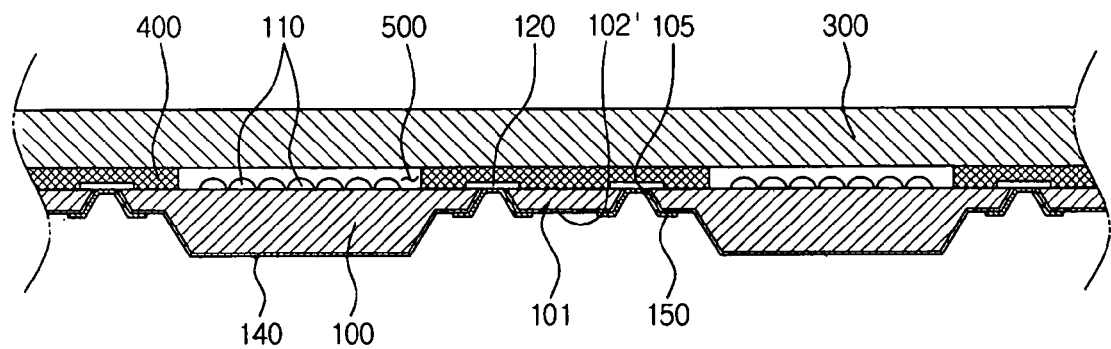
Figure 25:
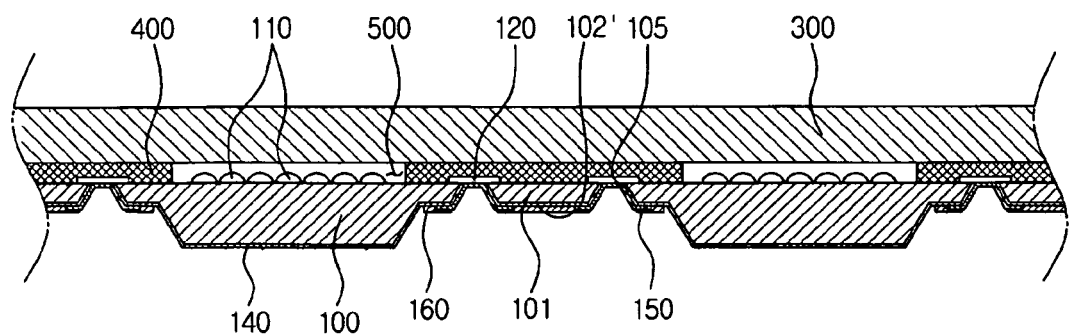

Also, as shown in FIG. 24, the seed metal 150 may be formed on the via hole 105 before forming the solder bump 130, so as to electrically connect the electrode pad 120 and the solder bump 130. As shown in FIG. 25, after forming the seed metal 150, the passivation layer 160 may be formed on an exposed surface of the seed metal 150.

Figure 26:
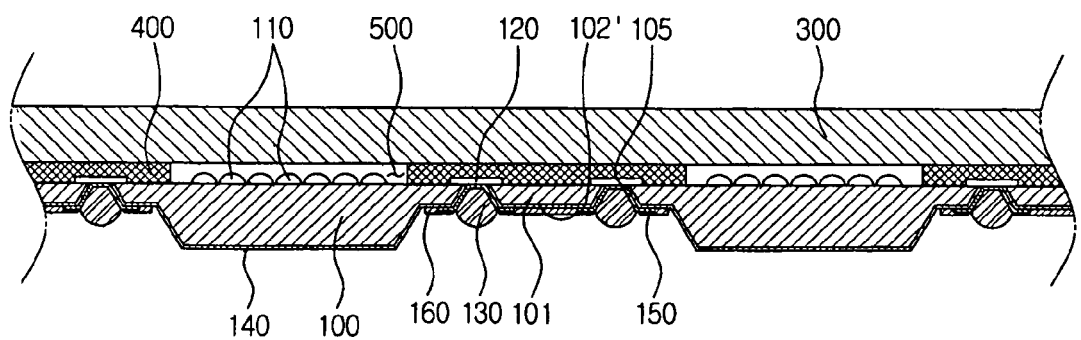

As shown in FIG. 26, after forming the passivation layer 160, the solder bump 130 is formed on the bottom surface of the electrode pad 120 to be electrically connected to the electrode pad 120 via the via hole 105.

Figure 27:
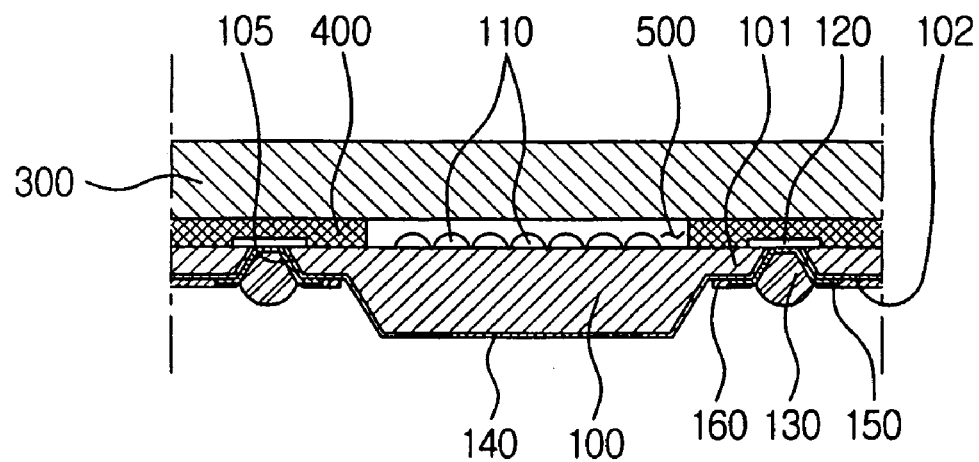

Next, as shown in FIG. 27, the substrate 100 is diced along the groove 102'.

In this case, the dicing of the substrate 100 may be performed by utilizing a general dicing equipment. Accordingly, the substrate 100 and the transparent cover 300 may be divided into individual micro-element packages, each including at least one of the plurality of micro-elements 110. The recess 102 may be provided on the bottom surface of the substrate 100 which is then divided into the individual micro-element packages.

Figure 28:
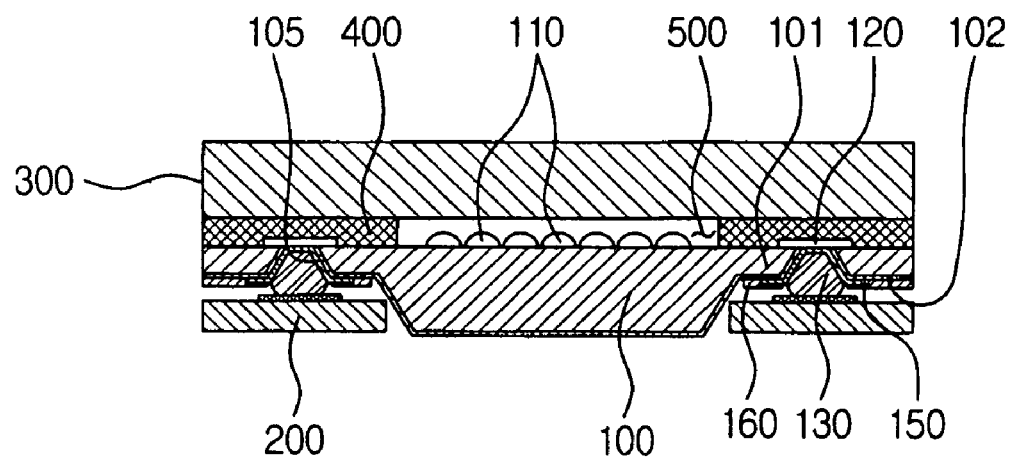

As shown in FIG. 28, the circuit board 200 is attached to the substrate 100 which is divided into the individual micro-element package by a dicing process.

In attaching the circuit board 200, manufacturing of the package may be completed by attaching the circuit board 200 to the surrounding portion 101 with at least one portion of the circuit board 200 being accommodated in the recess 102 via the groove 102', and providing the solder bump 130 on the circuit board 200 utilizing a reflow process or method of ultrasonic bonding. A flexible PCB or a rigid PCB may be utilized for the circuit board 200.

In the present exemplary embodiment, the disposing of the transparent cover 300 is performed before forming the groove 102', but the present invention is not limited thereto or restricted thereby.

Also, in the present exemplary embodiment, the circuit board 200 is connected to the substrate 100 via the solder bump 130, but the present invention is not limited thereto. Each micro-element package may be connected to the circuit board 200 via a conductive film such as an Anisotropic Conductive Film (ACF) or a conductive paste such as an Anisotropic Conductive Paste (ACP), and not utilizing the solder bump 130.

Figure 29:
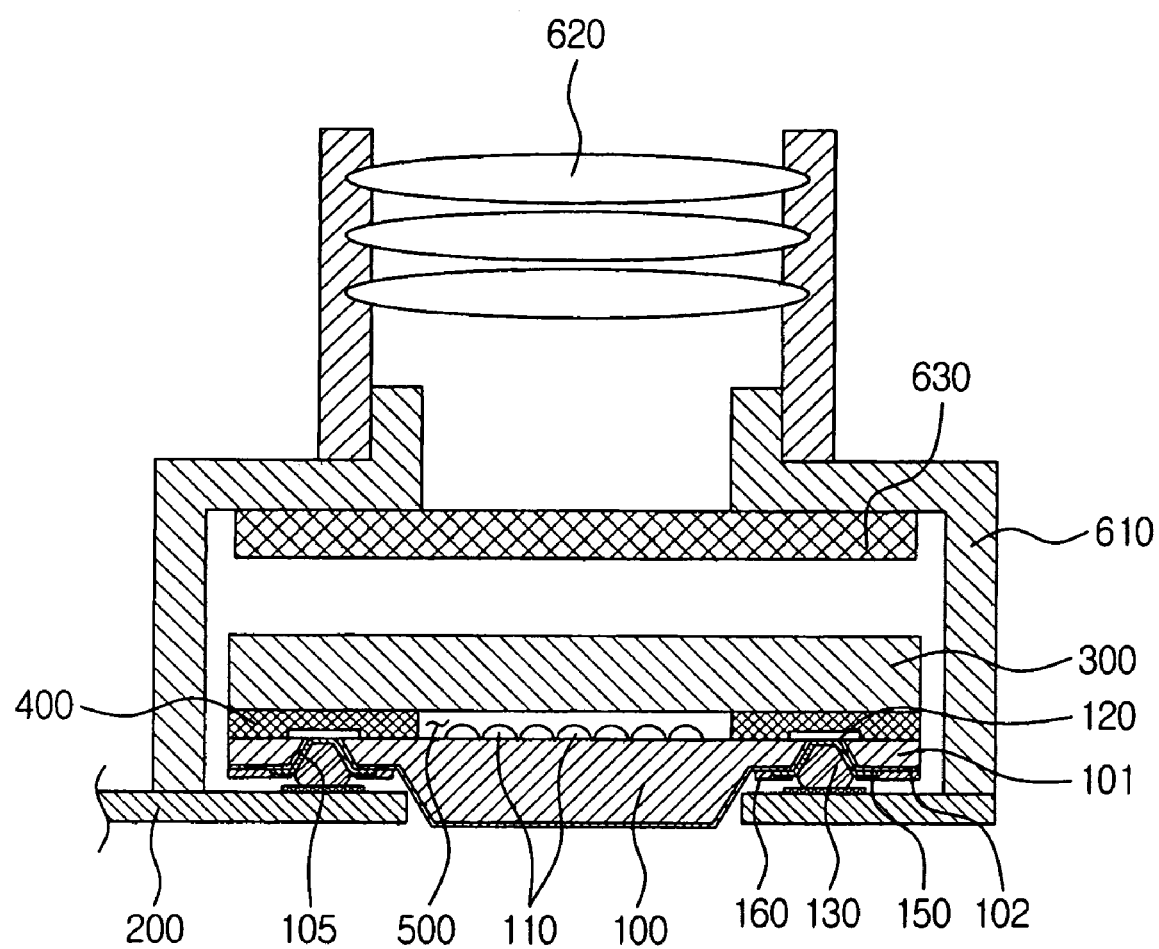
FIG. 29 is a cross-sectional view illustrating a structure of a micro-element package applied to a camera module according to an exemplary embodiment of the present invention.

FIG. 29 is a structure of a micro-element package applied to a camera module according to an exemplary embodiment of the present invention.

As shown in FIG. 29, the micro-element package according to an exemplary embodiment of the present invention may be adapted to a camera module. Since the entire height of the camera module may be decreased, a light, thin, and small-sized module may be manufactured. In FIG. 29, the camera module includes a housing 610, a lens 620, and an infrared ray filter 630.

As described above, according to an exemplary embodiment of the present invention, a micro-element package may be manufactured thinner and in a smaller size and can be advantageous for mass production due to simplifying its structure and reducing manufacturing costs.

Also, according to an exemplary embodiment of the present invention, a thin package may be manufactured while maintaining a rigidity of a substrate. Also, a process for an electrical connection via a via hole may be simplified.

Also, according to an exemplary embodiment of the present invention, a micro-element package may be manufactured at a wafer level package process. Accordingly, the micro-element package according to the present invention may be advantageous for mass production. Also, a product price may be decreased by reducing manufacturing costs.

Also, according to an exemplary embodiment of the present invention, a sealed air cavity may be formed above a micro-element. Accordingly, a contamination caused by particles may be prevented during a manufacturing process. Also, a decrease of a yield may be prevented.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A micro-element package comprising:
a substrate comprising a micro-element on a top surface of the substrate and a surrounding portion provided around the micro-element, wherein the surrounding portion is thinner than a portion of the substrate on which the micro-element is disposed; and
a circuit board that is electrically connected to the micro-element by utilizing the surrounding portion as a medium.

2. The micro-element package of claim 1, wherein an electrode is provided on a top surface of the surrounding portion to be electrically connected to the micro-element.

3. The micro-element package of claim 2, wherein a via hole is formed in the surrounding portion to expose a bottom surface of the electrode.

4. The micro-element package of claim 3, wherein a solder bump is provided on the bottom surface of the electrode.

5. The micro-element package of claim 1, wherein the micro-element comprises at least one of a micromechanical engineering element, a microelectronics element, and an opto-electronics element.

* * * * *